United States Patent
Gopinathan et al.

(10) Patent No.: US 8,754,797 B2
(45) Date of Patent: Jun. 17, 2014

(54) ASYNCHRONOUS ANALOG-TO-DIGITAL CONVERTER HAVING RATE CONTROL

(75) Inventors: Venugopal Gopinathan, Bangalore (IN); Udayan Dasgupta, Bangalore (IN); Ganesan Thiagarajan, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 23 days.

(21) Appl. No.: 13/599,539

(22) Filed: Aug. 30, 2012

(65) Prior Publication Data
US 2014/0062751 A1 Mar. 6, 2014

(51) Int. Cl.
*H03M 1/12* (2006.01)
*H03M 1/10* (2006.01)

(52) U.S. Cl.
CPC . *H03M 1/12* (2013.01); *H03M 1/10* (2013.01)
USPC .......... 341/155; 341/118; 341/120; 341/139; 341/142; 341/166

(58) Field of Classification Search
USPC .......... 341/118, 120, 155, 157, 158, 159, 166
See application file for complete search history.

(56) References Cited

U.S. PATENT DOCUMENTS

| | | | |
|---|---|---|---|
| 6,404,372 B1 | 6/2002 | Heithoff | |
| 6,462,693 B1 * | 10/2002 | Rivoir | 341/155 |
| 6,850,180 B2 | 2/2005 | Hales | |
| 6,961,015 B2 * | 11/2005 | Kernahan et al. | 341/165 |
| 7,248,200 B2 * | 7/2007 | Komuro et al. | 341/166 |
| 7,466,258 B1 | 12/2008 | Akopyan et al. | |
| 7,495,589 B1 * | 2/2009 | Trifonov et al. | 341/118 |
| 7,834,789 B2 * | 11/2010 | Straeussnigg et al. | 341/143 |
| 7,978,111 B2 * | 7/2011 | Sun et al. | 341/155 |
| 8,018,366 B2 * | 9/2011 | Henzler et al. | 341/155 |
| 8,330,637 B2 * | 12/2012 | Lee et al. | 341/166 |
| 2004/0070529 A1 * | 4/2004 | Kamas et al. | 341/155 |
| 2008/0024346 A1 | 1/2008 | Kok et al. | |
| 2008/0158037 A1 * | 7/2008 | Hsien et al. | 341/164 |
| 2009/0091485 A1 | 4/2009 | Daniels et al. | |

(Continued)

OTHER PUBLICATIONS

"A 10-bit 5kHz ieyel-crossing ADC," 2011 20th European Conf. on Circuit Theory and Design (ECCTD), pp. 564-567.

(Continued)

*Primary Examiner* — Linh Nguyen
(74) *Attorney, Agent, or Firm* — Alan A. R. Cooper; W. James Brady, III; Frederick J. Telecky, Jr.

(57) ABSTRACT

An apparatus is provided. A comparison circuit is configured to receive an analog signal. A reference circuit is coupled to the comparison circuit and is configured to provide a plurality of reference signals to the comparison circuit. A conversion circuit is coupled to the comparison circuit and is configured to detect a change in the output of the comparison circuit. A time-to-digital converter (TDC) is coupled to the comparison circuit. A timer is coupled to the comparison circuit. A rate control circuit is coupled to the conversion circuit. An output circuit is coupled to the rate control circuit and the TDC, where the output circuit is configured to output at least one of a synchronous digital representation of the analog signal and an asynchronous digital representation of the analog signal.

16 Claims, 7 Drawing Sheets

(56) References Cited

U.S. PATENT DOCUMENTS

| | | |
|---|---|---|
| 2009/0251349 A1* | 10/2009 | Wiesbauer et al. ........... 341/166 |
| 2010/0328120 A1 | 12/2010 | Van der Plas et al. |
| 2011/0057823 A1 | 3/2011 | Harpe |
| 2011/0109489 A1* | 5/2011 | Henzler et al. ................ 341/143 |
| 2013/0058437 A1* | 3/2013 | Oshima et al. ................ 375/316 |

OTHER PUBLICATIONS

Koscielnik, Dariusz et al., "Designing Time-to-Digital Converter for Asynchronous ADCs", 2007. DDECS '07 IEEE, pp. 1-6, Apr. 11-13, 2007.

\* cited by examiner

ASYNCHRONOUS ANALOG-TO-DIGITAL CONVERTER HAVING RATE CONTROL

TECHNICAL FIELD

The invention relates generally to an analog-to-digital converter (ADC) and, more particularly, to an asynchronous ADC.

BACKGROUND

Turning to FIG. 1, a conventional, synchronous ADC 100 can be seen. In operation, a analog signal AIN is filtered by and/or amplified by filter/driver 102 (which is typically an anti-aliasing filter) and provided to a sample-and-hold (S/H) circuit 104. The S/H circuit 104 is then able to periodically (usually at equidistant sampling instants as shown in FIG. 2) sample the analog signal AIN based on a signal from timing circuit 110. Conversion circuit 106 (which may be a type of quantizer) is then able to convert the sampled analog signal AIN to a digital representation having quantization levels (i.e., as shown in FIG. 2) using a clocking or timing signal from timing circuit 110. Output circuit 108 (which may include a digital correction circuit like an averager) generates the final digital signal DOUT.

ADC 100 can also be modified to be "level-crossing" ADC 150, as shown in FIG. 3. Here, the S/H circuit 104 and conversion circuit 106 are, respectively, replaced with a comparison circuit 154 (which may include comparators) and conversion circuit 156. For this ADC 150, it determines the time at which the analog signal AIN becomes greater than (or less than) the known, quantized levels (as shown in FIG. 4). Based on these times, the digital signal DOUT can be generated.

There are, however, some drawbacks to each of the ADCs 100 and 150. One drawback is that power consumption from the timing circuit 110 can be high because each ADC 100 and 150 may employ a large number of devices (i.e., comparators) or oversample at very high speeds to achieve a desired resolution. Therefore, there is a need for an improved ADC.

Some examples of conventional circuits are: U.S. Pat. No. 6,404,372; U.S. Pat. No. 6,850,180; U.S. Pat. No. 7,466,258; and Grimaldi et al., "A 10-bit 5 kHz level crossing ADC," 2011 20$^{th}$ European Conf. on Circuit Theory and Design (ECCTD), pp. 564-567.

SUMMARY

An embodiment of the present invention, accordingly, provides an apparatus. The apparatus comprises a comparison circuit that is configured to receive an analog signal; a reference circuit that is coupled to the comparison circuit and that is configured to provide a plurality of reference signals to the comparison circuit; a conversion circuit that is coupled to the comparison circuit and that is configured to detect a change in the output of the comparison circuit; a time-to-digital converter (TDC) that is coupled to the comparison circuit; a timer that is coupled to the comparison circuit; an output circuit that is coupled to the conversion circuit and the TDC, wherein the output circuit is configured to output at least one of a synchronous digital representation of the analog signal and an asynchronous digital representation of the analog signal; and an analog-to-digital converter (ADC) that is coupled to the conversion circuit, the timer, and the TDC, wherein the ADC is configured to be enabled by the timer when a predetermined period has lapsed.

In accordance with an embodiment of the present invention, the comparison circuit further comprises a plurality of comparators, wherein each comparator is coupled to the timer, the conversion circuit, and the reference circuit, and wherein each comparator is configured to receive the analog signal.

In accordance with an embodiment of the present invention, the TDC is configured to generate a time stamp that corresponds to a sampling instant for the ADC.

In accordance with an embodiment of the present invention, the TDC is configured to generate a time stamp for the output circuit.

In accordance with an embodiment of the present invention, the conversion circuit further comprises a plurality of conversion logic circuits, wherein each conversion logic circuit is coupled between at least one of the comparators and the output circuit.

In accordance with an embodiment of the present invention, the reference circuit further comprises: a reference logic circuit; and a reference generator that is coupled between the reference logic circuit and the comparison circuit.

In accordance with an embodiment of the present invention, the reference generator further comprises a plurality of digital-to-analog converters (DACs), wherein each DAC is coupled between the reference logic circuit and at least one of the comparators.

In accordance with an embodiment of the present invention, a method is provided. The method comprises receiving an analog signal; comparing the analog input signal to first and second reference signals to generate a first comparison result; registering the first comparison result and a first time stamp corresponding to the first comparison result; generating a first portion of a digital signal from the first comparison result; if the comparison result remains substantially the same for a predetermined interval, enabling an ADC to generate a second comparison result at a sampling instant; generating a second time stamp that corresponds to the sampling instant; registering the second comparison result and the second time stamp; and generating a second portion of the digital signal from the second comparison result.

In accordance with an embodiment of the present invention, the second reference signal is greater than the first reference signal, and wherein the method further comprises: if the analog signal becomes greater than the second reference signal, generating a third comparison result reflecting that the analog signal has become greater than the second reference signal; registering the third comparison result and a third time stamp corresponding to the third time comparison result; generating a third portion of a digital signal from the third comparison result; and generating a third reference signal that is greater than the second reference signal.

In accordance with an embodiment of the present invention, the method further comprises: if the analog signal becomes less than the first reference signal, generating a fourth comparison result reflecting that the analog signal has become less than the first reference signal; registering the fourth comparison result and a fourth time stamp corresponding to the fourth time comparison result; generating a fourth portion of a digital signal from the fourth comparison result; and generating a fourth reference signal that is less than the first reference signal.

In accordance with an embodiment of the present invention, an apparatus is provided. The apparatus comprises a comparison circuit having: a first comparator that is configured to receive an analog signal; and a second comparator that is configured to receive an analog signal; a reference circuit that is coupled to the comparison circuit and that is configured to provide a first reference signal to the first comparator and a second reference signal to the second comparator; a conversion circuit that is coupled to the comparison circuit and that is configured to detect a change in the output of the comparison circuit; a TDC that is coupled to the comparison circuit; a timer that is coupled to the comparison circuit; an output circuit that is coupled to the conversion circuit and the TDC, wherein the output circuit is configured to output at least one of a synchronous digital representation of the analog signal and an asynchronous digital representation of the analog signal; and an ADC that is coupled to the conversion circuit, the timer, and the TDC, wherein the ADC is configured to be enabled by the timer when a predetermined period has lapsed.

In accordance with an embodiment of the present invention, the timer is configured to cause the first and second comparators to resample the analog signal after a predetermined period.

In accordance with an embodiment of the present invention, the conversion circuit further comprises: a first conversion logic circuit that is coupled between the first comparator and the output circuit; and a second conversion logic circuit that is coupled between the second comparator and the output circuit.

In accordance with an embodiment of the present invention, each of the first and second conversion logic circuits further comprises a register.

In accordance with an embodiment of the present invention, the reference generator further comprises: a first DAC that is coupled between the reference logic circuit and the first comparator; and a second DAC that is coupled between the reference logic circuit and the second comparator.

In accordance with an embodiment of the present invention, the apparatus further comprises a filter that is coupled to each of the first and second comparators so as to provide the analog signal.

In accordance with an embodiment of the present invention, the output circuit further comprises a sin c interpolator.

In accordance with an embodiment of the present invention, a method is provided. The method comprises receiving an analog signal; comparing the analog input signal to first and second reference signals to generate a first comparison result; registering the first comparison result and a first time stamp corresponding to the first comparison result; generating a first portion of a digital signal from the first comparison result; adjusting at least one of the first and second reference signals; generating a second comparison result if the analog signal reaches an adjusted one of the first and second reference signals within a predetermined interval; and generating a second portion of the digital signal from the second comparison result.

In accordance with an embodiment of the present invention, the second reference signal is greater than the first reference signal, and wherein the method further comprises: if the analog signal becomes greater than the second reference signal, generating a third comparison result reflecting that the analog signal has become greater than the second reference signal; registering the third comparison result and a third time stamp corresponding to the third time comparison result; generating a third portion of a digital signal from the third comparison result; and generating a third reference signal that is greater than the second reference signal.

In accordance with an embodiment of the present invention, the method further comprises: if the analog signal becomes less than the first reference signal, generating a fourth comparison result reflecting that the analog signal has become less than the first reference signal; registering the fourth comparison result and a fourth time stamp corresponding to the fourth time comparison result; generating a fourth portion of a digital signal from the fourth comparison result; and generating a fourth reference signal that is less than the first reference signal.

In accordance with an embodiment of the present invention, the step of adjusting further comprises increasing the first reference signal.

In accordance with an embodiment of the present invention, the first reference signal is increased at a rate of an initial difference between the first and second reference signals divided by the length of the predetermined interval minus a blanking period.

In accordance with an embodiment of the present invention, the step of adjusting further comprises decreasing the second reference signal.

In accordance with an embodiment of the present invention, each of the first and second reference signals are adjusted at a rate of one-half of an initial difference between the first and second reference signals divided by the length of the predetermined interval minus a blanking period.

In accordance with an embodiment of the present invention, the step of adjusting further comprises increasing a third reference signal that is at least one significant bit (LSB) less than the first reference signal.

In accordance with an embodiment of the present invention, an apparatus is provided. The apparatus comprises a comparison circuit that is configured to receive an analog signal; a reference circuit having: a reference generator that is coupled to the comparison circuit so as to provide a plurality of reference signals to the comparison circuit; and a reference logic circuit that is coupled to the reference generator, wherein the reference logic circuit is configured to dynamically adjust at least one of the plurality of reference signals; a conversion circuit that is coupled to the comparison circuit and that is configured to detect a change in the output of the comparison circuit; a time-to-digital converter (TDC) that is coupled to the comparison circuit; a timer that is coupled to the comparison circuit; and an output circuit that is coupled to the conversion circuit and the TDC, wherein the output circuit is configured to output at least one of a synchronous digital representation of the analog signal and an asynchronous digital representation of the analog signal.

In accordance with an embodiment of the present invention, an apparatus is provided. The apparatus comprises a comparison circuit having: a first comparator that is configured to receive an analog signal; and a second comparator that is configured to receive an analog signal; a reference circuit having: a reference generator that is coupled to the comparison circuit so as to provide a first reference signal to the comparison circuit and a second reference signal to the second comparator; and a reference logic circuit that is coupled to the reference generator, wherein the reference logic circuit is configured to dynamically adjust at least one first and second reference signals; a conversion circuit that is coupled to the comparison circuit and that is configured to detect a change in the output of the comparison circuit; a TDC that is coupled to the comparison circuit; a timer that is coupled to the comparison circuit; and an output circuit that is coupled to the conversion circuit and the TDC, wherein the output circuit is configured to output at least one of a synchronous digital representation of the analog signal and an asynchronous digital representation of the analog signal.

In accordance with an embodiment of the present invention, the reference circuit increases first and decreases second reference signals a rate of one-half of an initial difference between the first and second reference signals divided by the length of a predetermined interval minus a blanking period.

In accordance with an embodiment of the present invention, the reference circuit increases first reference signal at a rate of an initial difference between the first and second reference signals divided by the length of a predetermined interval minus a blanking period.

In accordance with an embodiment of the present invention, the comparison circuit further comprises a third comparator that is configured to receive the analog signal, and wherein the reference generator further comprises a third DAC that is coupled to the third comparator so as to receive a third reference signal, and wherein the third reference signal is increased at the rate.

In accordance with an embodiment of the present invention, an apparatus is provided. The apparatus comprises a comparison circuit that is configured to receive an analog signal; a reference circuit that is coupled to the comparison circuit and that is configured to provide a plurality of reference signals to the comparison circuit; a conversion circuit that is coupled to the comparison circuit and that is configured to detect a change in the output of the comparison circuit; a time-to-digital converter (TDC) that is coupled to the comparison circuit; a timer that is coupled to the comparison circuit; a rate control circuit that is coupled to the conversion circuit; and an output circuit that is coupled to the rate control circuit and the TDC, wherein the output circuit is configured to output at least one of a synchronous digital representation of the analog signal and an asynchronous digital representation of the analog signal.

In accordance with an embodiment of the present invention, an apparatus is provided. The apparatus comprises a comparison circuit having: a first comparator that is configured to receive an analog signal; and a second comparator that is configured to receive an analog signal; a reference circuit that is coupled to the comparison circuit and that is configured to provide a first reference signal to the first comparator and a second reference signal to the second comparator; a conversion circuit that is coupled to the comparison circuit and that is configured to detect a change in the output of the comparison circuit; a TDC that is coupled to the comparison circuit; a timer that is coupled to the comparison circuit; a rate control circuit that is coupled to the conversion circuit; and an output circuit that is coupled to the rate control circuit and the TDC, wherein the output circuit is configured to output at least one of a synchronous digital representation of the analog signal and an asynchronous digital representation of the analog signal.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
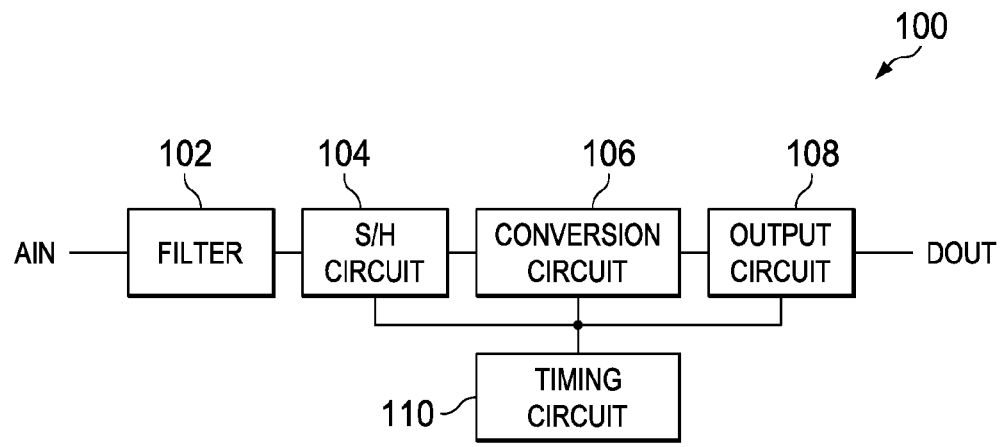
FIGS. 1 and 3 are diagrams of examples of conventional ADCs.
Figure 3:
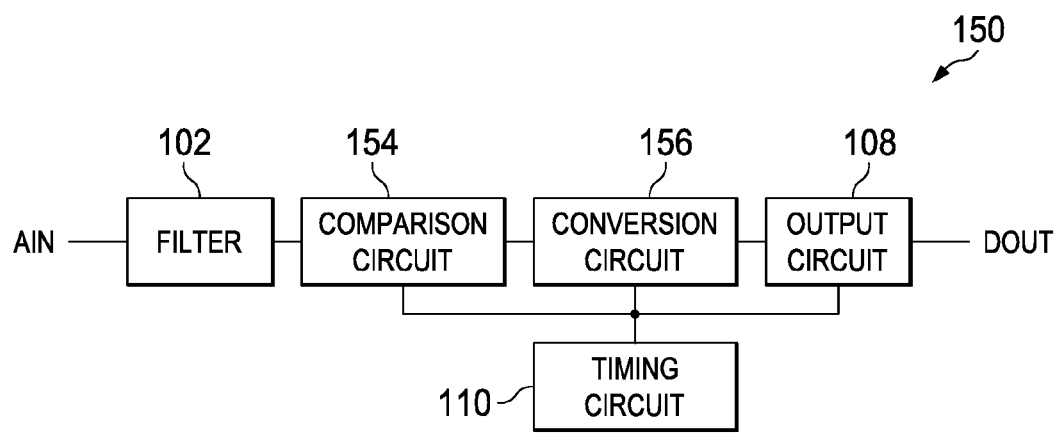
Figure 2:
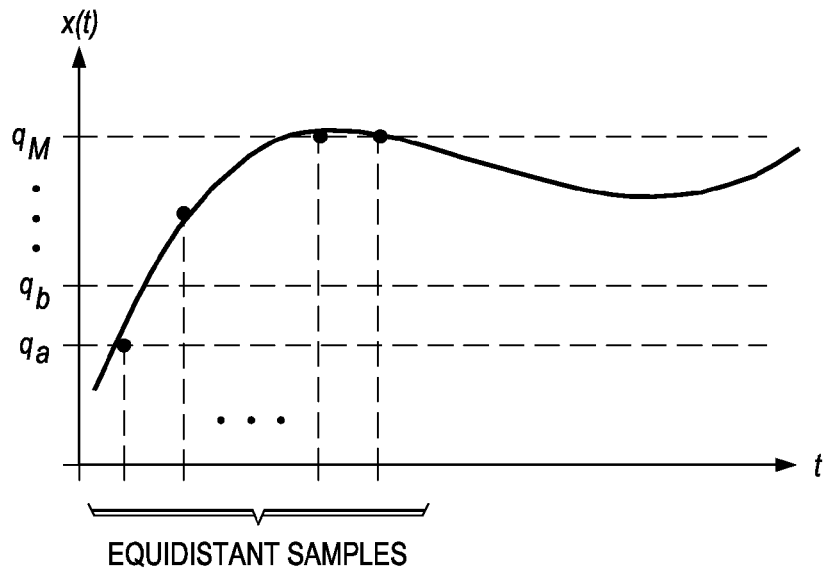
FIGS. 2 and 4 are diagrams depicting the operations of the ADCs of FIGS. 1 and 3, respectively.
Figure 4:
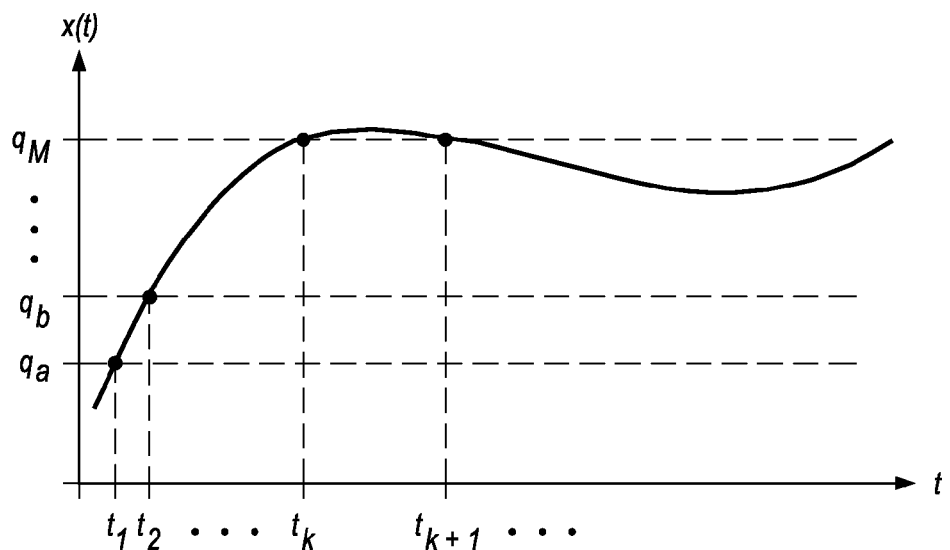

Refer now to the drawings wherein depicted elements are, for the sake of clarity, not necessarily shown to scale and wherein like or similar elements are designated by the same reference numeral through the several views.

Figure 5:
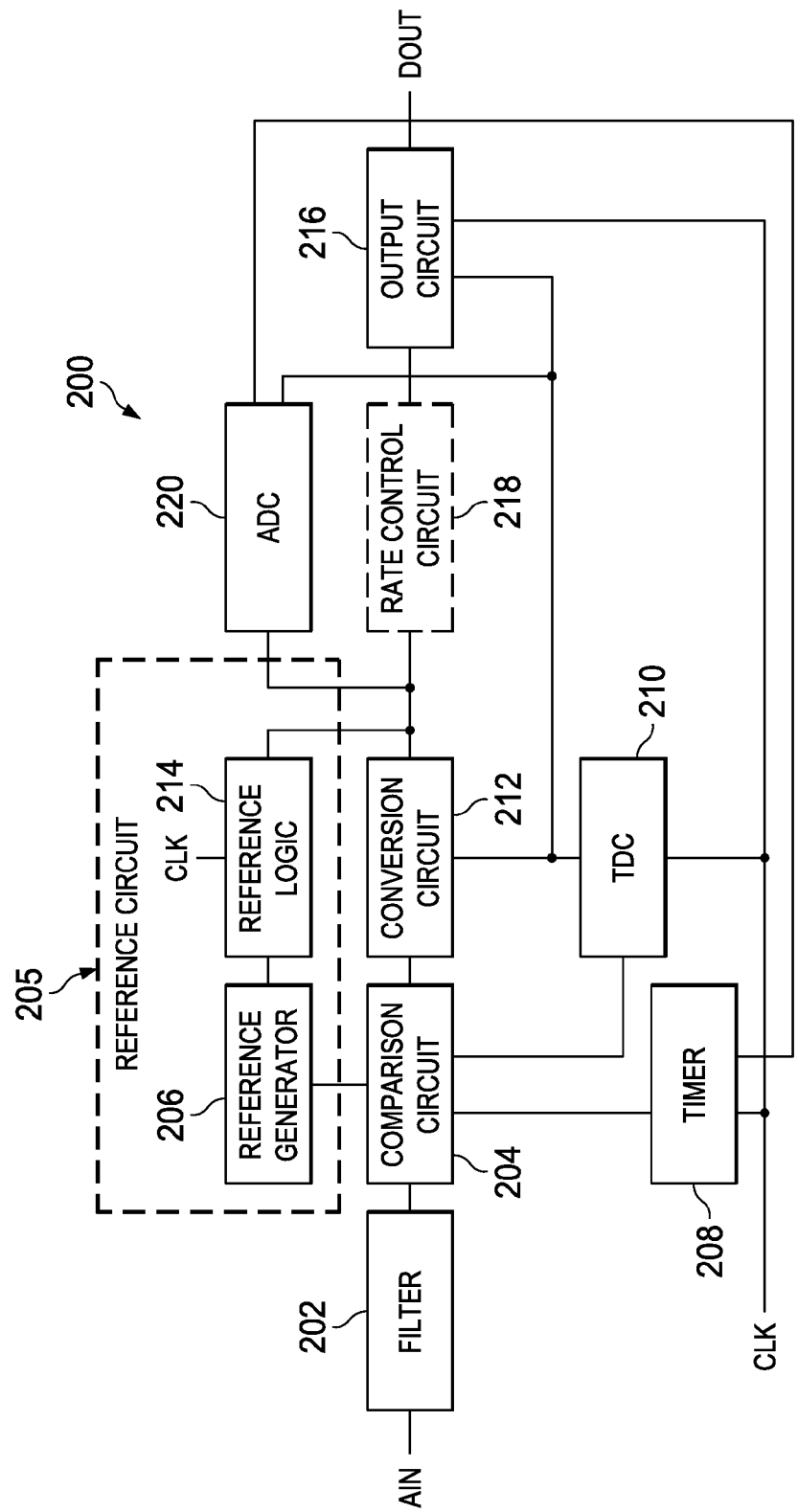
FIG. 5 is a diagram of an example of an ADC in accordance with the present invention.

Turning to FIG. 5, an example of an ADC 200 in accordance with the present invention can be seen. Similar to ADCs 100 and 150, ADC 200 includes a filter 202 (which can, for example, be an anti-aliasing filter) that filters the analog signal AIN for comparison circuit 204. The comparison circuit 204 (which is coupled to the filter 202 so as to receive the analog signal AIN) also performs a similar function to the comparison circuit 154 in that it is configured to detect when the analog signal AIN crosses (i.e., becomes greater or less than) its reference or quantization levels so as to generate a comparison result that reflects the amplitude of the analog signal AIN. A difference, however, is that the reference signals (i.e., reference voltages) provided to comparison circuit 204 are not static (like comparison circuit 154), but, instead, the reference circuit 205 (which can generally comprise reference generator 206 and reference logic circuit 214) dynamically varies these reference signals.

Figure 6:
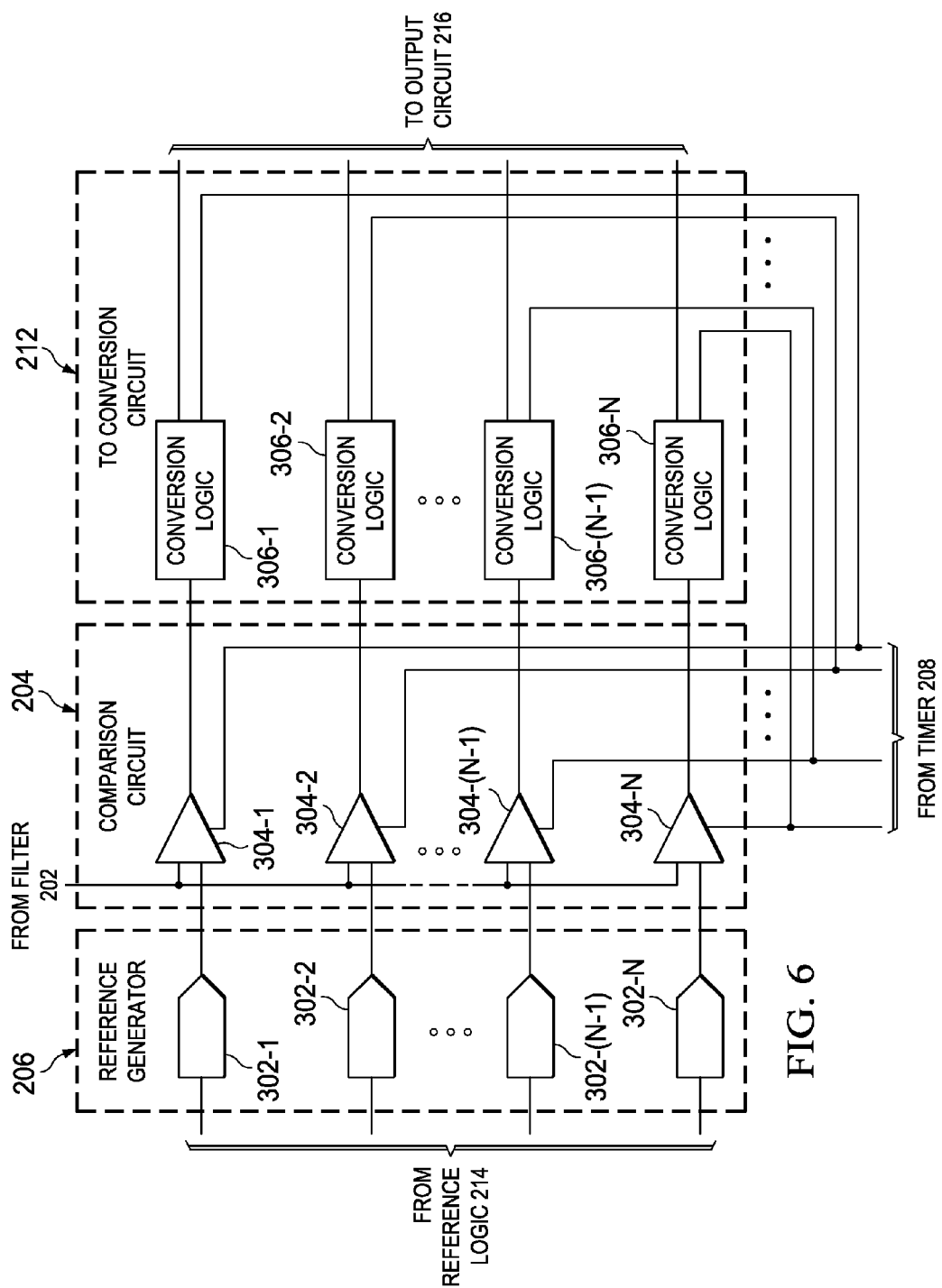
FIG. 6 is a diagram depicting examples of the reference generator, comparison circuit, and conversion circuit of FIG. 5 in greater detail.

By dynamically varying the reference signals, the configuration for comparison circuit 204 can be simplified (as compared to comparison circuit 154). As an example (which is shown in FIG. 6), the comparison circuit 204 can be comprised of comparators 304-1 to 304-N and reference generator 206 can be comprised of digital-to-analog converters (DACs) 302-1 to 302-N. While multiple comparators 304-1 to 304-N are shown, the number of comparators 304-1 to 304-N (and the number of corresponding DACs 302-1 to 302-N) can be reduced to as few as two irrespective of the desired output resolution.

Once the comparison result is generated by the comparison circuit 204, a digital signal DOUT (which is the digital representation of analog signal AIN) can be generated. This is normally accomplished by the conversion circuit 212 and output circuit 218. Usually, the conversion circuit 212 is a logic circuit that is configured to detect when a change has occurred in the comparison result from comparison circuit 204. As an example, there can be a conversion logic circuit 306-1 to 306-N (as shown in FIG. 6) for each comparator 304-1 to 304-N, where each of these conversion logic circuits 306-1 to 306-N can include a register. Based on the output from the conversion circuit 212, the output circuit 216 (which can include a sin c interpolator) is able to output a synchronous or asynchronous signal as the digital signal DOUT, where the signal reconstruction can be performed using a time stamp from the time-to-digital converter (TDC) 210. Typically, the TDC 210 should have an accuracy (i.e., within a few picoseconds) that is related to the bandwidth K of the ADC 200 and Signal to Noise-plus-Distortion Ratio or SNDR (i.e., SNDR (in dB) for a sinewave of frequency K Hz is given by SNDR=$-10 \text{Log}_{10}(1-\text{Sin c}(K\ T_q))-3$ where the function "Sin c(x)" is defined as $\mathrm{Sin}(\pi x)/(\pi x)$ for any real value x and $T_q$ is in represented in seconds).

There are several manners in which the ADC 200 can operate, and examples of which can operate can be seen in FIGS. 7-10. For the examples shown in FIG. 7-10, the conversion circuit 212 employs two comparators 304-1 and 304-2, and the reference signals REF1 and REF2 (which generally correspond to level L1 to L4) are provided by DACs 302-1 and 302-2. Also, for the example shown in FIG. 10, the conversion circuit 212 employs three comparators 304-1 to 304-3, and the reference signals REF1 to REF3 (which generally correspond to levels M1 to M5) are provided by DACs 302-1 to 302-3.

Figure 7:
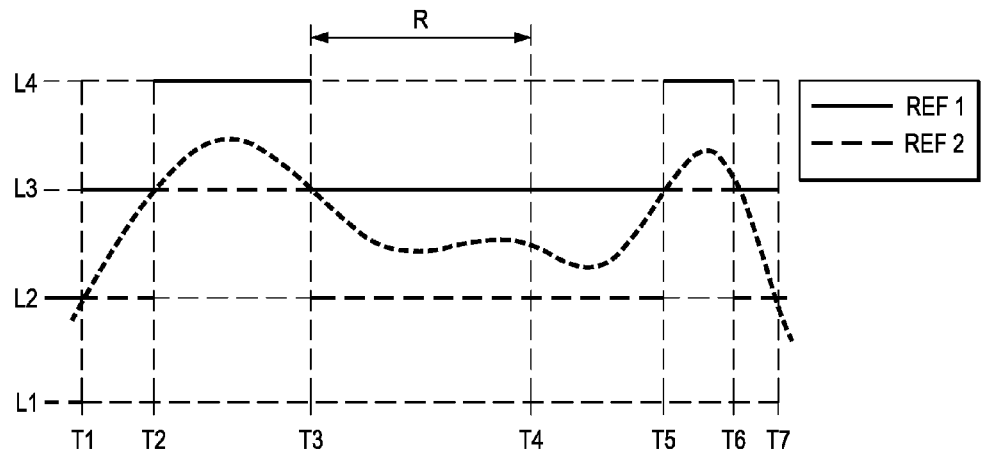
FIGS. 7-11 are diagrams depicting example operations of the reference circuit of FIG. 5.

Turning first to the example shown in FIG. 7, a level-crossing approach is employed. As shown, the analog signal AIN has an amplitude between levels L2 and L3 between time T1 and T2. At time T2, the analog signal AIN crosses level L3, allowing reference signals REF1 and REF2 to shift to levels L3 and L4, respectively. The analog signal AIN then crosses level L3 at time T3. Then, with a conventional level-crossing ADC (i.e., ADC 150), its comparison circuit (i.e., comparison circuit 154) would continue to output the same comparison result for the duration between times T3 and T5. However, to be able to perform a reconstruction within output circuit 216 (i.e., sin c interpolation, polynomial fitting, or piecewise polynomial fitting), a timing constraint should be applied to the ADC 200. Namely, each pair of consecutive samples should be separated by less than a interval R (for a desired Nyquist sampling rate), and, after this interval R has lapsed (for example at time T4), the ADC 220 (which can for example be a flash ADC, successive approximation register or SAR ADC, a pipelined ADC, and so forth) can sample the analog signal AIN. This interval R may, for example, be K/2, where K is 1/B and B is the bandwidth of ADC 200. Thus, timer 208 is employed to cause or force the comparison circuit 204 to resample the analog signal AIN at time T4 (after an interval R has lapsed from the last sample). Additionally, at time T2, the TDC 210 is able to generate a time stamp for the output circuit 216 so as to enable reconstruction. Then, at times T5 to T7 (which are separated from times T4 to T6, respectively, by an interval that is shorter than interval R), the analog signal AIN crosses levels L3 and, which causes TDC 210 to generate time stamps (for output circuit 216 and conversion circuit 212) at each time T5 to T7 and which causes the reference circuit 205 to change the levels for reference signals REF1 and REF2, similar to the changes that occurred at times T2 and T3. The changing of the levels of reference signals REF1 and REF2 is generally accomplished by reference logic circuit 214 monitoring output from conversion circuit 212 and adjusting DACs 302-1 and 302-2 accordingly.

Figure 8:
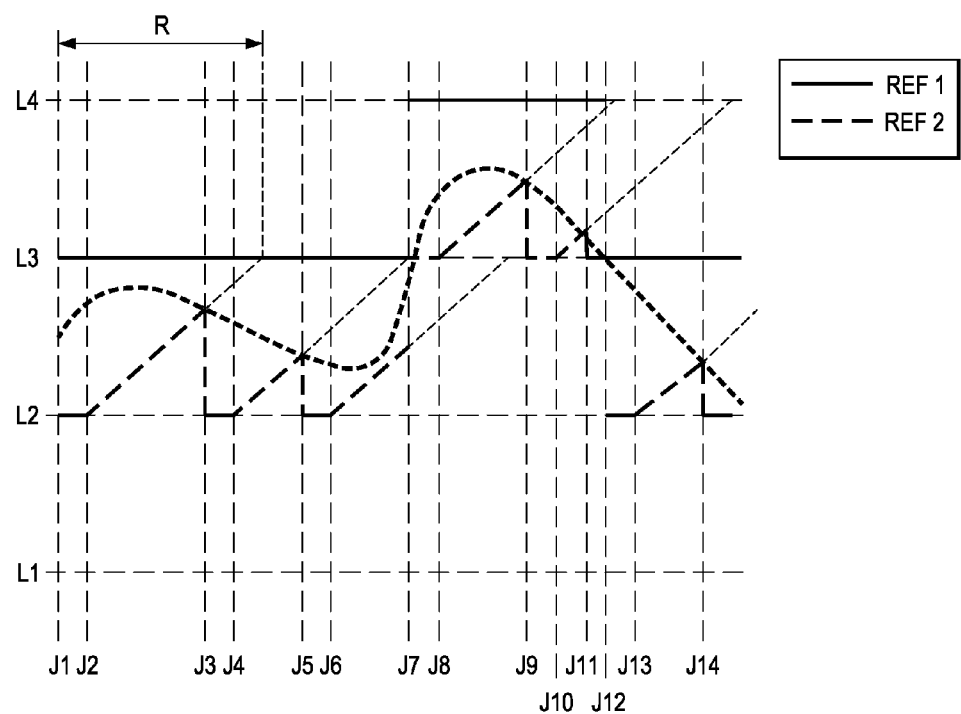

Alternatively, a "single slope" approach (as shown in FIG. 8) may be employed. For this approach, one of the reference signals REF1 or REF2 can be varied or adjusted. So long as there is a relationship between the interval R and the slope of the increase (or decrease), the timing constraint can be applied. By adjusting reference signal REF1 or REF2, though, an error (known as "chattering") that results from the creation of adjacent samples with similar amplitudes (i.e., voltages) and similar time stamps can be introduced. So, to reduce the occurrence of chattering, a blanking or pre-convergence period (i.e., between times J1 and J2) can be employed. As shown in this example, reference signal REF2 is increased at a rate that is approximately equal to initial difference between reference signals REF1 and REF2 (i.e., L3-L2) divided by interval R minus a blanking or pre-convergence period. By employing this adjustment to reference signal REF2, the reference signal REF2 (with adjustments being introduced at times J2, J4, J6, J8, J10 and J13) intersects the analog signal AIN at times J3, J5, J9, J11, and J14, causing the comparison circuit 204 to resample the analog signal at each time and causing the TDC 210 to issue time stamps at each time. Following the intersection, the reference signal REF2 returns to its original level (i.e., level L2). Also, at times J7 and J12 in this example, the analog signal crosses level L3, which causes the reference circuit 205 to change the levels for reference signals REF1 and REF2.

Figure 9:
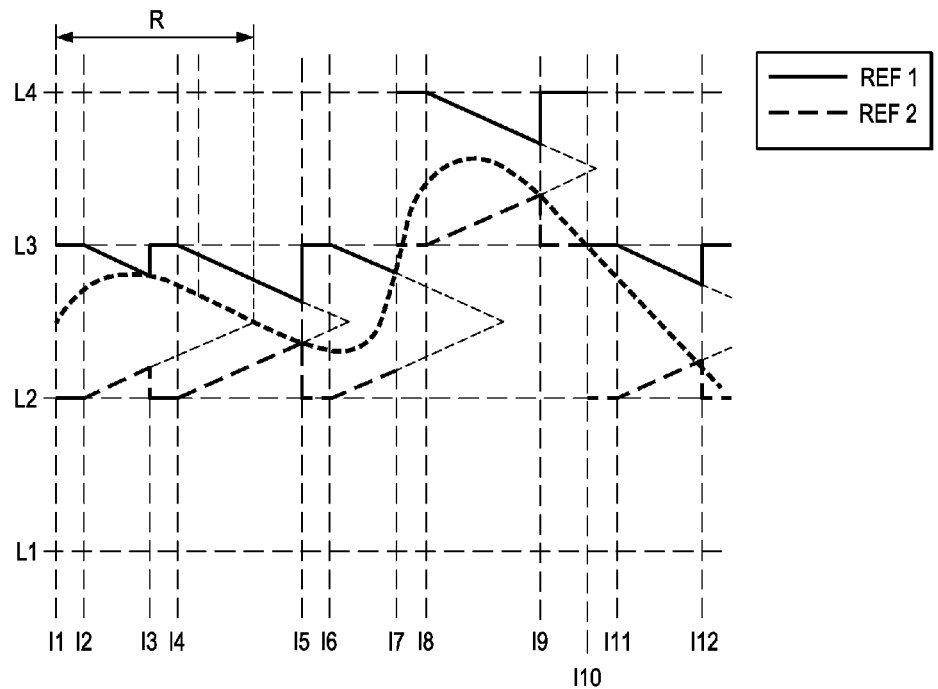

In another alternative, a "dual slope" approach (as shown in FIG. 9) may be employed. With the "dual slope" approach shown in this example, both the reference signals REF1 and REF2 are adjusted following a blanking or pre-convergence period (which can be employed to reduce the occurrence of chattering resulting from the adjustments to both reference signals REF1 and REF2). Similar to the "single slope" approach, the timing constraint can be applied if there is a relationship between the interval R and the slope of the increase (or decrease), and, for this example, the reference signals REF1 and REF2 are decreased and increased (respectively) at a rate that is one-half of the initial difference between reference signals REF1 and REF2 (i.e., L3-L2) divided by interval R minus a blanking period, allowing both to converge at a voltage midway between levels (i.e., between L2 and L3). By employing this adjustment to reference signals REF1 and REF2 (with adjustments being introduced at times I2, I4, I6, I8, and J11), the analog signal AIN is intersected at times I3, I5, I9, and J12, causing the comparison circuit 204 to resample the analog signal at each time and causing the TDC 210 to issue time stamps at each time. Following the intersection, the reference signals REF1 and REF2 return to their original levels (i.e., level L2). Also, at times I7 and I10 in this example, the analog signal crosses level L3, which causes the reference circuit 205 to change the levels for reference signals REF1 and REF2 and which causes the TDC 210 to issue time stamps.

Figure 10:
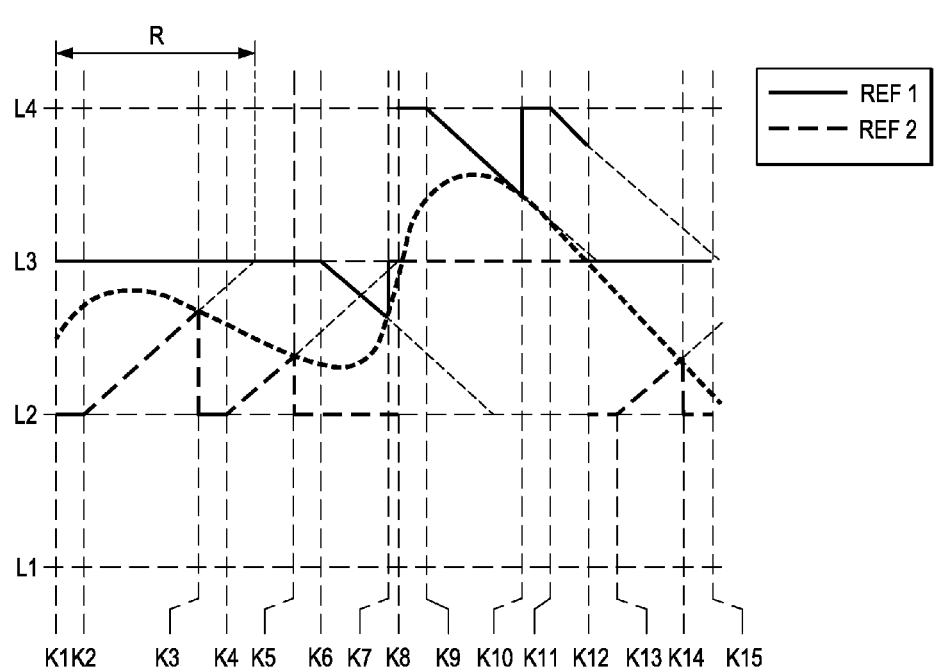

In yet another alternative, a "smart slope" approach (as shown in FIG. 10) may be employed. The "smart slope" approach is similar to the "dual slope" approach in that both the reference signals (i.e., REF1 and REF2) can be adjusted; however, unlike the "dual slope" approach, one of the reference is adjusted at a given time. The reference signal (i.e., REF1) that is adjusted is selected based on separation from the levels (i.e., L2) that bound the analog signal. Specifically and for example, the reference signal REF1 is increased between times K2 and K3 (following a blanking period between times K1 and K2). At time K3 in this example, the comparator (i.e., 304-1 and 304-2) can indicate the difference between levels L2 and L3 and the analog signal AIN, which allows the reference logic 214 to select the reference signal having greater difference to be selected (after a blanking period). As shown in this example, reference signal REF1 (which is nominally set to level L2) has the greater difference, so the reference signal REF1 is adjusted in the next cycle (between times K4 and K5. Alternatively, the time to reach the analog signal AIN may be used to determine the greater difference. By adjusting the reference signal (i.e., REF1) using the greater difference, the sample rate can be decreased. Similar adjustments can be seen for the periods K6/K7, K9/K10, K11/K12, and K13/K14 following the blanking periods K5/K6, K8/K9, K10/K11, and K12/K13.

Figure 11:
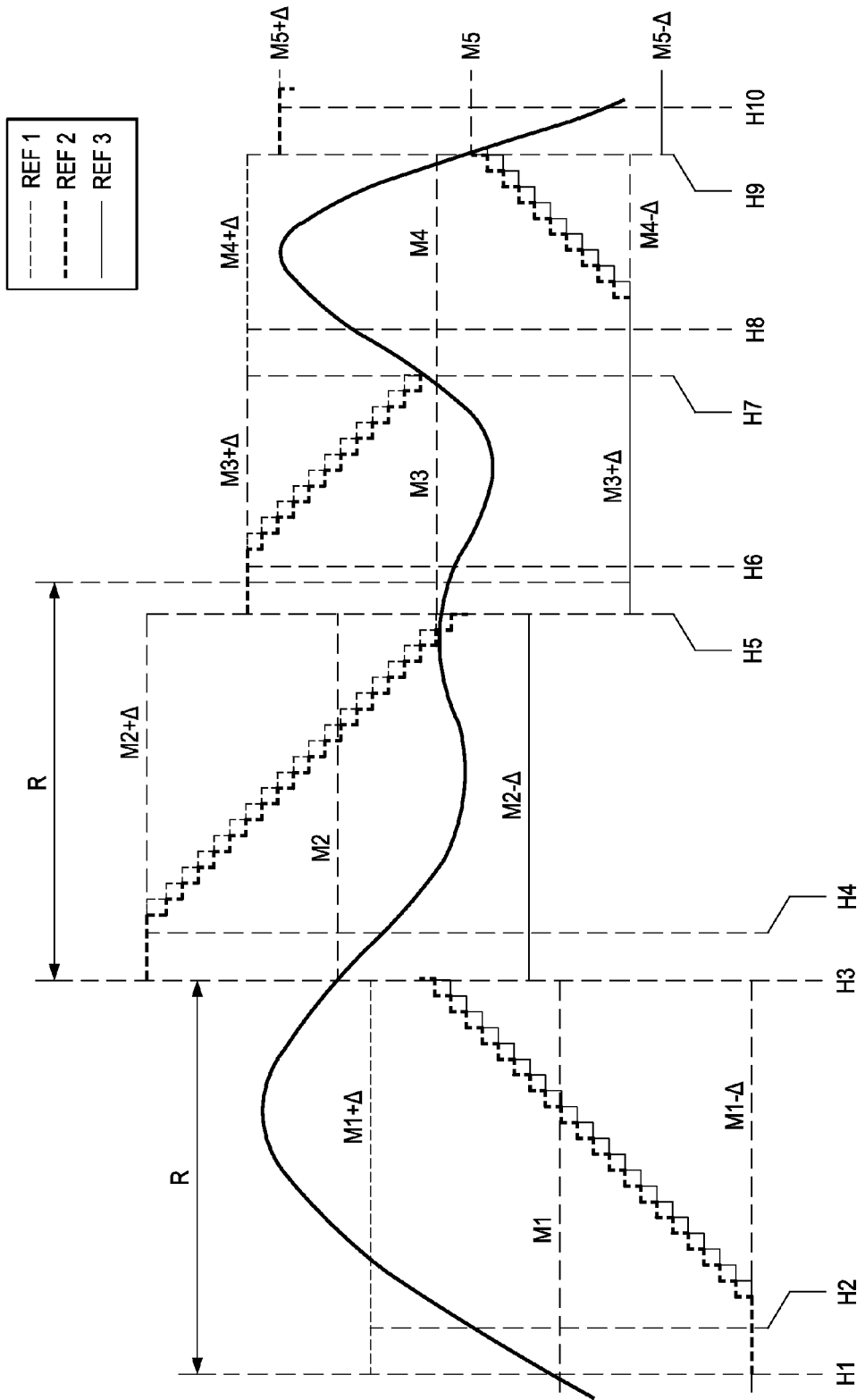

In each of the "single slope," "dual slope," and "smart slope" approaches detailed above, chattering remains an issued because of the changes to reference signals REF1 and REF2. To help further reduce the occurrence of chatter, a third comparator 302-3, using reference signal REF3, can be employed in a modified "smart slope" approach (referred to as a "modified smart slope"). As shown in this example of FIG. 11, the levels are not fixed as with the approach shown in FIGS. 7-10; instead, the levels are adjusted at each sampling instant. Specifically and as shown, the midpoint levels M1, M2, M3, M4, and M5 are selected at each sampling instant with the upper and lower levels being set at a difference $\Delta$ above and below the midpoint levels M1, M2, M3, M4, and M5. In this example, the midpoint level M1 is set at time H1, and, after a blanking period at time H2, the reference signal REF2 is increased from level M1-$\Delta$, while reference signal REF1 is held as generally constant. Additionally, reference signal REF3 (which begins at the same level as reference signal REF2) increases or decreases at the same rate as reference signal REF2, but at least one significant bit (LSB) lower. At time H3, the interval R has lapsed before the adjusted reference signals REF2 and REF3 reach the analog signal AIN, so ADC 220 samples the analog signal AIN, setting midpoint level M2 at time H3. After a blanking period between times H3 and H4, references REF2 and REF3 (which are initially set to level M3+$\Delta$) begin decreasing (where reference signal REF3 is one LSB above reference signal REF2) because the difference between analog signal AIN and level M2+$\Delta$ is greater than the difference between the analog signal AIN and level M2-$\Delta$ at time H4. Similarly, after the blanking periods at times H5/H6, H7/H8, and H9/H10, reference signals REF1/REF2 (or REF2/REF3) can begin increasing (or decreasing) for midpoint levels M3, M4, and M5. It should also be noted that adaptive levels (such as those shown with respect to levels M1 to M5 of FIG. 10) may be employed with the "single slope," "dual slope," and "smart slope" approaches of FIGS. 8-11 instead of fixed levels (i.e., levels L1 to L4).

With ADC 200 and many of the approaches detailed above, there may also be little control over the smallest gap or interval between samples. For example, there is a short interval between samples taken at times J11 and J12 in FIG. 8. Depending on the nature of analog signal AIN, the signal AIN may be severely oversampled; for example, when ADC has 16 levels, a full 64 samples per cycle (i.e., 32 times oversampled) for a full sinusoidal signal. Hence, rate control circuit 218 (which is generally a logic circuit) can be used to reduce the sampling rate. Typically, this is accomplished by ignoring samples that appear within a programmable threshold range, limiting the maximum instantaneous sampling frequency and reducing the average sampling rate.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a comparison circuit that is configured to receive an analog signal;
   a reference circuit that is coupled to the comparison circuit and that is configured to provide a plurality of reference signals to the comparison circuit;
   a conversion circuit that is coupled to the comparison circuit and that is configured to detect a change in the output of the comparison circuit;
   a time-to-digital converter (TDC) that is coupled to the comparison circuit;
   a timer that is coupled to the comparison circuit;
   a rate control circuit that is coupled to the conversion circuit; and
   an output circuit that is coupled to the rate control circuit and the TDC, wherein the output circuit is configured to output at least one of a synchronous digital representation of the analog signal and an asynchronous digital representation of the analog signal.

2. The apparatus of claim 1, wherein the comparison circuit further comprises a plurality of comparators, wherein each comparator is coupled to the timer and the reference circuit, and wherein each comparator is configured to receive the analog signal.

3. The apparatus of claim 2, wherein the timer is configured to cause the comparison circuit to resample the analog signal after a predetermined period.

4. The apparatus of claim 3, wherein the TDC is configured to generate a time stamp for the output circuit.

5. The apparatus of claim 4, wherein the conversion circuit further comprises a plurality of conversion logic circuits, wherein each conversion logic circuit is coupled between at least one of the comparators and the rate control circuit.

6. The apparatus of claim 5, wherein the reference circuit further comprises:
   a reference logic circuit; and
   a reference generator that is coupled between the reference logic circuit and the comparison circuit.

7. The apparatus of claim 6, wherein the reference generator further comprises a plurality of digital-to-analog converters (DACs), wherein each DAC is coupled between the reference logic circuit and at least one of the comparators.

8. An apparatus comprising:
   a comparison circuit having:
      a first comparator that is configured to receive an analog signal; and
      a second comparator that is configured to receive an analog signal;
   a reference circuit that is coupled to the comparison circuit and that is configured to provide a first reference signal to the first comparator and a second reference signal to the second comparator;
   a conversion circuit that is coupled to the comparison circuit and that is configured to detect a change in the output of the comparison circuit;
   a TDC that is coupled to the comparison circuit;
   a timer that is coupled to the comparison circuit;
   a rate control circuit that is coupled to the conversion circuit; and
   an output circuit that is coupled to the rate control circuit and the TDC, wherein the output circuit is configured to output at least one of a synchronous digital representation of the analog signal and an asynchronous digital representation of the analog signal.

9. The apparatus of claim 8, wherein the timer is configured to cause the first and second comparators to resample the analog signal after a predetermined period.

10. The apparatus of claim 9, wherein the TDC is configured to generate a time stamp for the output circuit.

11. The apparatus of claim 10, wherein the conversion circuit further comprises:
    a first conversion logic circuit that is coupled between the first comparator and the rate control circuit; and
    a second conversion logic circuit that is coupled between the second comparator and the rate control circuit.

12. The apparatus of claim 11, wherein each of the first and second conversion logic circuits further comprises a register.

13. The apparatus of claim 12, wherein the reference circuit further comprises:
- a reference logic circuit; and
- a reference generator that is coupled between the reference logic circuit and the comparison circuit.

14. The apparatus of claim 13, wherein the reference generator further comprises:
- a first DAC that is coupled between the reference logic circuit and the first comparator; and
- a second DAC that is coupled between the reference logic circuit and the second comparator.

15. The apparatus of claim 14, wherein the apparatus further comprises a filter that is coupled each of the first and second comparators so as to provide the analog signal.

16. The apparatus of claim 15, wherein output circuit further comprises a sin c interpolator.

* * * * *